United States Patent
Tomita et al.

(10) Patent No.: US 6,731,008 B1
(45) Date of Patent: *May 4, 2004

(54) SEMICONDUCTOR DEVICE WITH CONDUCTIVE CONTACT LAYER STRUCTURE

(75) Inventors: Kazuo Tomita, Hyogo (JP); Shigenori Sakamori, Hyogo (JP); Hiroshi Kimura, Hyogo (JP)

(73) Assignee: Renesas Technology Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/726,733

(22) Filed: Oct. 7, 1996

(30) Foreign Application Priority Data

Apr. 22, 1996 (JP) .............................. 8-100237

(51) Int. Cl.[7] .............................................. H04L 23/48
(52) U.S. Cl. ........................ 257/774; 257/296; 257/772; 257/773
(58) Field of Search ................................ 257/296, 774, 257/772, 773

(56) References Cited

U.S. PATENT DOCUMENTS

| | | | | |
|---|---|---|---|---|
| 4,656,732 A | * | 4/1987 | Teng et al. | 257/774 |
| 5,475,266 A | * | 12/1995 | Rodder | 257/774 |
| 5,545,926 A | * | 8/1996 | Kohyama et al. | 257/774 |
| 5,565,372 A | * | 10/1996 | Kim | 438/253 |
| 5,792,703 A | * | 8/1998 | Bronner et al. | 438/620 |
| 6,127,730 A | * | 10/2000 | Smith | 257/750 |
| 6,127,734 A | * | 10/2000 | Kimura | 257/774 |
| 6,140,705 A | * | 10/2000 | Liu | 257/774 |

FOREIGN PATENT DOCUMENTS

| | | |
|---|---|---|
| JP | 60-160653 | 8/1985 |
| JP | 2-271646 | 11/1990 |
| JP | 7-106278 | 4/1995 |
| JP | 9-191084 | 7/1997 |

OTHER PUBLICATIONS

Kirk–Othmer, ("Encyclopedia of Chemical Technology," vol. 13, Third Edition, pp. 637–640 (1981).*
Muller, "Device Electronics for Integrated Circuits," Second Edition, pp. 96–98 (1986).*

* cited by examiner

*Primary Examiner*—Allan R. Wilson
*Assistant Examiner*—Matthew E. Warren
(74) *Attorney, Agent, or Firm*—McDermott, Will & Emery

(57) ABSTRACT

A conductive layer contact structure is provided, in which a contact hole of a diameter smaller than the resolution of photolithography technique is formed in a stabilized manner by an etching with low aspect ratio, the contact resistance regarding a conductive layer formed through this contact hole is low, and the step coverage of the conductive layer is satisfactory such that it is not electrically short-circuited with other conductive layers. A silicon oxide film and a silicon nitride film are formed on a gate electrode as first insulation layers. A silicon oxide film is formed as a second insulation layer having a high etching selectivity with respect to the silicon nitride film provided as an upper insulation layer of the first insulation layer. Reaching a surface of an $n^+$ diffused layer formed at a surface of a silicon substrate as a conductive region, a contact hole is formed. A sidewall spacer is formed at the inner sidewall of the silicon oxide film defining a hole. Due to this sidewall spacer, the contact hole having a diameter smaller than the resolution of photolithography technique is defined by the inner sidewall of the silicon oxide film and silicon nitride film.

13 Claims, 14 Drawing Sheets

SEMICONDUCTOR DEVICE WITH CONDUCTIVE CONTACT LAYER STRUCTURE

BACKGROUND OF THE INVENTION

1. Field of the Invention

The present invention relates to a semiconductor device and a method of manufacturing the same, and particularly to a conductive layer contact structure for a conductive region formed at the surface of a semiconductor substrate between the conductive layers formed on the semiconductor substrate and a method of manufacturing the same.

2. Description of the Background Art

Recently, as can be seen from the fact that DRAMs (Dynamic Random Access Memories) and the like are becoming integrated to a higher degree, degree of integration of semiconductor devices is being made higher, and thus dimension of the diameters of the contact holes is becoming more and more reduced as a result of increase in degree of integration of the elements incorporated into the semiconductor devices. In order to form a smaller contact hole, polycrystalline silicon mask opening method and self align contact (SAC) opening method are being considered.

FIG. 26 is a partial cross sectional view of a semiconductor device, showing a contact hole formed by polycrystalline silicon mask opening method at a memory device region of a semiconductor device. Referring to FIG. 26, an isolation oxide film 2 is formed at the surface of a p type polycrystalline silicon substrate 1 by the method of LOCOS (Local Oxidation of Silicon). On the surfaces of p type silicon substrate 1 and isolation oxide film 2, gate oxide films 3 are formed. A gate electrode 4 is formed on this gate oxide film 3. An insulation film 5 is formed on gate electrode 4. On the surface of p type silicon substrate 1 at both sides of gate electrode 4, n⁻ diffused regions 6 containing an n type impurity of low concentration are formed by the method of LDD (Lightly Doped Drain). At the side surfaces of gate oxide film 3, gate electrode 4 and insulation film 5, sidewall spacers 7 are formed as insulation films. In addition, an n⁺ diffused layer 8 containing n type impurity of high concentration is formed at the surface of p type silicon substrate 1 so as to join n⁻ diffused regions 6. Covering gate electrode 4, an interlayer insulation film 11 of silicon oxide film is formed on the surface of p type silicon substrate 1, employing TEOS (Tetraethyl Orthosilicate) as the material. In this interlayer insulation film 11, a contact hole 105 of a small diameter is formed by etching interlayer insulation film 11 to reach a portion of the surface of n⁺ diffused layer 8.

Description will be made for a method of forming the contact hole shown in FIG. 26, with reference to FIGS. 27A to 27B and 27B to 30B.

FIGS. 27A to 30A are partial cross sectional views illustrating the process of forming the contact hole shown in FIG. 26 at the memory device region in the order of the steps performed. FIGS. 27B to 30B are partial cross sectional views illustrating the process of forming the contact hole shown in FIG. 26 at the peripheral circuit region in the order of the steps performed.

Referring to FIGS. 27A and FIG. 27B, isolating oxide film 2, gate oxide film 3, gate electrode 4, insulation film 5, n⁻ diffused layer 6, sidewall spacer 7, n⁺ diffused layer 8 and interlayer insulation film 11 having a thickness of 3000 to 4000 Å are formed on p type silicon substrate 1. Thereafter, a polycrystalline silicon film 101 having a thickness of 1500 to 3000 Å is deposited on the entire surface of the interlayer insulation film, and a silicon oxide film 102 employing TEOS as its material (hereinafter referred to as "TEOS oxide film") is further deposited thereon. On this TEOS oxide film 102, a resist (not shown) is formed, and using the patterned resist as a mask, TEOS oxide film 102 is partially etched. Thus, a hole 103a having a diameter of about 0.3 μm is formed to reach the surface of polycrystalline silicon film 101. Then, on the entire surface of TEOS oxide film 102, a TEOS oxide film is deposited again. By etching back the entire surface of this TEOS oxide film with anisotropical etching, a sidewall spacer 103 of TEOS oxide film is formed at the inner sidewall of hole 103a which had been formed at TEOS oxide film 102.

Thereafter, as shown in FIGS. 28A and 28B, polycrystalline silicon film 101 is etched using TEOS oxide film 102 and sidewall spacer 103 as a mask so as to form a hole 104 having a diameter of 0.08 to 0.12 μm. Then, TEOS oxide film 102 and sidewall spacer 103 are etched away.

Then, referring to FIGS. 29A and 29B, polycrystalline silicon film 101 is used as a mask to etch interlayer insulation layer 11 thereby forming a contact hole 105 with a small diameter. Thereafter, as shown in FIGS. 30A and 30B, polycrystalline silicon film 101 is removed by having its surface entirely subjected to etching. Thus, the contact hole shown in FIG. 26 is formed.

When forming a contact hole with polycrystalline silicon mask opening method as described above, there has been the following problems. First of all, when a contact hole of a small diameter having a high aspect ratio, for example, not lower than 4, is formed at interlayer insulation layer 11, the etching rate would be extremely low, and thus it was very difficult to open a contact hole by an accurate etching. In addition, since it is difficult to bury the material of the conductive layer inside the contact hole after the contact hole is formed, it was difficult to form a conductive layer along the inner sidewall of the contact hole such that a satisfactory step coverage is obtained. Accordingly, there has been problems such as disconnection of conductive layer 106 and increase in contact resistance between conductive layer 106 and n⁺ diffused layer 8, as shown in FIG. 31.

Moreover, in the case of forming a contact hole with polycrystalline silicon mask opening method, when etching back the entire surface of polycrystalline silicon film 101, there has been a problem that etching is performed at the peripheral circuit region until the surface of gate electrode 4 is exposed, as shown in FIG. 30B. This is because the thickness of interlayer insulation layer 11 covering the surface of gate electrode 4 is thin due to the wide interval between the gate electrodes.

FIG. 32 is a partial cross sectional view showing a semiconductor device having a contact hole formed by self align contact opening method. Referring to FIG. 32, a gate oxide film 3 is formed on the surface of a p type silicon substrate 1. A gate electrode 4 is formed on gate oxide film 3. An insulation film 5 is formed on gate electrode 4. N⁻ diffused regions 6 are formed at the surface of p type silicon substrate 1 at both sides of gate electrode 4 by the method of LDD. Sidewall spacer 7 is formed at the side surface of gate oxide film 3, gate electrode 4 and insulation film 5. N⁺ diffused regions 8 are formed at the surface of p type silicon substrate 1 so as to join n⁻ diffused layers 6. Silicon oxide film 9 is formed on the surface of p type silicon substrate 1 covering insulation film 5 and sidewall spacer 7. A silicon nitride film 10 is formed on silicon oxide film 9.

Moreover, an interlayer insulation layer 11 of TEOS oxide film is formed on silicon nitride film 10. Contact hole 110 is formed to penetrate silicon oxide film 9, silicon nitride film 10 and interlayer insulation layer 11 to reach a portion of the surface of n+ diffused layer 8. A polycrystalline silicon layer 17 and a tungsten silicide layer 18 are formed as a conductive layer for being in electrical connection with n+ diffused layer 8 via contact hole 110. This conductive layer has two-layered structure including polycrystalline silicon 17 and tungsten silicide 18 to reduce interconnection resistance.

Referring next to FIGS. 33 to 36, description is made for a method of forming the contact hole of FIG. 32. FIGS. 33 to 36 are partial cross sectional views illustrating the process of forming the contact hole of FIG. 32 in the order of the steps performed.

Referring to FIG. 33, gate oxide film 3, gate electrode 4, insulation film 5, sidewall spacer 7, n− diffused layer 6, n+ diffused layer 8, silicon oxide film 9, silicon nitride film 10 and interlayer insulation film 11 are formed on p type silicon substrate 1. Thereafter, a resist film 107 is formed on interlayer insulation film 11, and a hole 108 is opened at resist film 107.

Then, as shown in FIG. 34, interlayer insulation film 11 is subjected to etching using resist film 107 (FIG. 33) as a mask, thereby forming a hole 109. Resist film 107 is then removed.

Thereafter, as shown in FIG. 35, by etching silicon nitride film 10 and silicon oxide film 9 successively, a contact hole 110 is opened.

Then, as shown in FIG. 36, polycrystalline silicon layer 17 and tungsten silicide layer 18 are formed as conductive layers so as to be electrically connected to n+ diffused layer 8 via contact hole 110. Thus, the contact hole is formed with self align contact opening method, and the conductive layer contact structure is formed.

When the contact hole is formed by self align contact opening method as describe above, the diameter of contact hole 110 would be about 0.30 μm and the distance between the gate electrodes 4 would be 0.32 to 0.36 μm, such that there would be a higher possibility that locations of contact hole 110 and gate electrode below may be overlapped. If the locations of contact hole 110 and gate electrode 4 is overlapped, a contact hole would be formed as shown in FIG. 37, and a conductive layer contact structure as shown in FIG. 38 would be formed. In such a case, when silicon oxide film 9 is over etched due to uniformity of the etching inside the surface upon opening contact hole 110, insulation film 5 and sidewall spacer 7 are subjected to etching, as shown in FIG. 39. As a result, there has been a problem that polycrystalline silicon layer 17 forming the conductive layer and gate electrode 4 is brought into contact and are electrically short-circuited. In addition, since in self align contact opening method a resist patterned by photolithography technique is used as a mask to etch interlayer insulation layer 11 as shown in FIGS. 33 to 35, it was impossible to form a contact hole having a diameter smaller than the resolution of the photolithography technique.

SUMMARY OF THE INVENTION

One object of the present invention is to form a contact hole having a diameter smaller than the resolution of the photolithography technique.

In addition, another object of the present invention is to form a contact hole with a desired size in a stabilized manner by etching involving a low aspect ratio.

Furthermore, another object of the present invention is to form a contact hole in which a conductive layer connected to a conductive region of a semiconductor substrate via the contact hole will not be electrically short-circuited to a conductive layer below.

A further object of the present invention is to form a conductive layer contact structure having a low contact resistance.

A still further object of the present invention is to form a conductive layer contact structure in which the step coverage of the conductive layer is satisfactory at the inner sidewall of a contact hole.

In addition, a further object of the present invention is to improve the alignment margin upon forming a contact hole.

A semiconductor device having a conductive layer contact structure according to one aspect of the present invention includes a first conductive layer, a conductive region, a first insulation layer, a second insulation layer, a sidewall insulation layer and a second conductive layer. The first conductive layer is formed on a main surface of a semiconductor substrate. The conductive region is formed at the main surface of the semiconductor substrate between the first conductive layers. The first insulation layer has a first hole reaching the surface of the conductive region, and is formed on the first conductive layer. The second insulation layer has a second hole in communication with the first hole, is formed on the first insulation layer and has a high etching selectivity with respect to the first insulation layer. The sidewall insulation film is formed at the inner sidewall of the second insulation layer defining the second hole. The second conductive layer is formed within the first and second holes such that it is in electrical connection with the conductive region and is electrically insulated from the first conductive layer.

Preferably, the sidewall insulation film has a high etching selectivity with respect to the first insulation layer.

In addition, in accordance with a preferred embodiment of the present invention, the first insulation layer includes upper and lower insulation layers, and the second insulation layer has a high etching selectivity with respect to the upper insulation layer of the first insulation layer. Here, it is preferred that the sidewall insulation film has a high etching selectivity with respect to the upper insulation layer of the first insulation layer. In addition, the first hole is defined by the inner sidewall of the lower insulation layer of the first insulation layer while the second hole is defined by the inner sidewall of the upper insulation layer of the first insulation layer and the inner sidewall of the second insulation layer. The sidewall insulation film is formed at the inner sidewall of the upper insulation layer of the first insulation layer and the inner sidewall of the second insulation layer. The second hole includes a third hole defined by the inner sidewall of the upper insulation layer of the first insulation layer and a fourth hole smaller than the third hole defined by the inner sidewall of the second insulation layer.

The semiconductor device having a conductive layer contact structure according to another aspect of the present invention includes a first conductive layer, a conductive region, a first insulation layer, a second insulation layer and a second conductive layer. The first conductive layer is formed on a main surface of a semiconductor substrate. The conductive region is formed at the main surface of the semiconductor substrate between the first conductive layers. The first insulation layer has a first hole reaching the surface of the conductive region, and is formed on the first conductive layer. The second insulation layer has a second hole larger than the first hole which is in communication with the first hole, is formed on the first insulation layer, and has a high etching selectivity with respect to the first insulation layer. The second conductive layer is formed within the first and second holes so as to be electrically connected to the conductive region and to be electrically insulated from the first conductive layer.

In accordance with the above-described preferred embodiment of the invention, the first insulation layer includes upper and lower insulation layers, and the second insulation layer has a high etching selectivity with respect to the upper insulation layer of the first insulation layer. Here, an additional sidewall insulation film may also be formed at the inner sidewall of the second insulation layer defining the second hole. It is preferred that this sidewall insulation film has a high etching selectivity with respect to the upper insulation layer of the first insulation layer.

In addition, in accordance with another preferred embodiment of the present invention, a sidewall insulation film is additionally formed at the inner sidewall of the second insulation layer defining the second hole, and this sidewall insulation film has a high etching selectivity with respect to the first insulation layer.

In addition, the conductive layer contact structure according to the present invention is also applicable to the case in which the second hole exists at a location overlapping a portion of the first conductive layer.

A method of manufacturing a semiconductor device having a conductive layer contact structure according to another aspect of the present invention includes the following steps:

(a) forming a first conductive layer on a main surface of a semiconductor substrate;

(b) forming a conductive region at the main surface of the semiconductor substrate between the first conductive layers;

(c) forming a first insulation layer on the main surface of the semiconductor substrate and on the first conductive layer;

(d) forming the second insulation layer having a high etching selectivity with respect to the first insulation layer on the first insulation layer;

(e) forming a first hole reaching the surface of the first insulation layer in the second insulation layer by selectively removing the second insulation layer;

(f) forming a third insulation layer on the second insulation layer and within the first hole;

(g) forming a sidewall insulation film at the inner sidewall of the second insulation layer defining the first hole by selectively removing the third insulation layer;

(h) forming a second hole reaching the surface the conductive region in the first insulation layer by selectively removing the first insulation layer using the sidewall insulation film as a mask; and (i) forming a second conductive layer within the first and second holes such that it is electrically connected to the conductive,region and is electrically insulated from the first conductive layer.

According to a preferred embodiment of a manufacturing method of the above-described semiconductor device, the step of forming the first insulation layer includes forming a first insulation layer including upper and lower insulation layers on the main surface of the semiconductor substrate and on the first insulation layer. The step of forming the second insulation layer includes forming on the first insulation layer a second insulation layer having a high etching selectivity with respect to the upper insulation layer of the first insulation layer. Furthermore, the step of forming the second hole in the first insulation layer includes forming a hole in the upper insulation layer of the first insulation layer to reach the surface of the lower insulation layer of the first insulation layer by selectively removing the upper insulation layer of the first insulation layer using the sidewall insulation film as a mask, and forming a hole in the lower insulation layer of the first insulation layer to reach the surface of the conductive region by selectively removing the lower insulation layer of the first insulation layer using the upper insulation layer of the first insulation layer as a mask.

In addition, according to the above-described preferred embodiment of the manufacturing method of the semiconductor device in accordance with the invention, the step of forming the first insulation layer includes forming a first insulation layer including upper and lower insulation layers on the main surface of the semiconductor substrate and on the first conductive layer. Moreover, the step of forming the second insulation layer includes forming a second insulation layer having a high etching selectivity with respect to the upper insulation layer of the first insulation layer on the first insulation layer. Furthermore, the manufacturing method of the semiconductor device according to this preferred embodiment includes the step of forming a third hole in the upper insulation layer of the first insulation layer to reach the surface of the lower insulation layer of the first insulation layer by selectively removing the upper insulation layer of the first insulation layer after forming the first hole in the second insulation layer. The step of forming the third insulation layer includes forming a third insulation layer on the second insulation layer and within the first and third holes. The step of forming the sidewall insulation film includes forming a sidewall insulation film at the inner sidewall of the second insulation layer defining the first hole and the inner sidewall of the upper insulation layer of the first insulation layer defining the third hole by selectively removing the third insulation layer. The step of forming the second hole in the first insulation layer includes forming the second hole reaching the surface of the conductive region in the lower insulation layer of the first insulation layer by selectively removing the lower insulation layer of the first insulation layer using the sidewall insulation film as a mask. The step of forming the second conductive layer includes forming a second conductive layer inside the first, second and third holes.

The manufacturing method of the semiconductor device according to the above-described invention is also applicable to the case in which the first hole exists at a location overlapping a portion of the first conductive layer.

A method of manufacturing a semiconductor device having a conductive contact structure according to another aspect of the present invention includes the following steps:

(i) forming a first conductive layer on a main surface of a semiconductor substrate;

(ii) forming a conductive region at the main surface of the semiconductor substrate between the first conductive layers;

(iii) forming a first insulation layer including upper and lower insulation layers on the main surface of the semiconductor substrate and on the first conductive layer;

(iv) forming a second insulation layer having a high etching selectivity with respect to the upper insulation layer of the first insulation layer on the first insulation layer;

(v) forming a first hole reaching the surface of the first insulation layer in the second insulation layer by selectively removing the second insulation layer;

(vi) forming a third insulation layer having a high etching selectivity with respect to the upper insulation layer of the first insulation layer and having an etching rate different from that of the second insulation layer on the second insulation layer and within the first hole;

(vii) forming a sidewall insulation film at the inner sidewall of the second insulation layer defining the first hole by selectively removing the third insulation layer;

(viii) forming a second hole reaching the surface of the lower insulation layer of the first insulation layer by selectively removing the upper insulation layer of the first insulation layer using the sidewall insulation film as a mask;

(ix) removing the sidewall insulation film;

(x) forming a third hole in the lower insulation layer of the first insulation layer to reach the surface of the conductive region by selectively removing the lower insulation layer of the first insulation layer using the upper insulation layer of the first insulation layer as a mask; and (xi) forming a second conductive layer within the first, second and third holes such that it is electrically connected to the conductive region and is electrically insulated from the first conductive layer.

Since a method of forming a contact hole based on self align contact opening method is adopted in the conductive layer contact structure of the present invention formed in this way, a conductive layer contact structure having a low contact resistance can be obtained by an etching with low aspect ratio without the interconnection layer as the second conductive layer being in contact with the gate electrode as the first conductive layer at the peripheral circuit region. In addition, since a sidewall insulation film is formed at the inner sidewall defining the hole of the second insulation layer, a contact hole smaller than the resolution of photolithography technique can be formed to have a desired size in a stabilized manner without the interconnection layer as the second conductive layer being in contact or without being electrically short-circuited with the gate electrode as the first conductive layer at the memory device region also. Furthermore, it is possible to form a second conductive layer with a satisfactory step coverage within the contact hole along the inner sidewall of the contact hole.

Moreover, in a semiconductor device having a conductive layer contact structure according to another aspect of the present invention, the sidewall insulation film is removed in the end within the contact hole, and thus it is possible to obtain a structure having a lower contact hole as compared to the case in which conductive layer contact structure is formed with the sidewall insulation film remaining in the end.

In addition, according to a preferred embodiment of the conductive layer contact structure of the present invention, a sidewall insulation film is formed along the inner sidewall defining the hole of the second insulation layer and the inner sidewall defining the hole of the upper insulation layer of the first insulation layer, and thus the contact hole is tapered forward, in other words, would have its diameter of the opening increased smoothly as it extends upwards from the main surface of the semiconductor substrate. As a result, the step coverage of the second conductive layer formed at the inner sidewall of the contact hole would be satisfactory.

Also, even if the interval between the gate electrodes is wide and the location of the second insulation hole does not overlap the location of the gate electrode below, alignment margin upon formation of the contact hole would be improved as compared to the conventional self align contact opening method.

Thus, according to the present invention, a contact hole with a diameter smaller than the resolution of photolithography technique can be formed by an etching with a low aspect ratio. Even when the upper second conductive layer is formed to be in contact with the conductive region of the semiconductor substrate through that contact hole, it is possible to provide a semiconductor device having a conductive layer contact structure in which the second insulation layer is not electrically short-circuited. Accordingly, a conductive layer contact structure appropriate for a highly integrated semiconductor device such as a bit line contact structure of a DRAM and a storage node contact structure of a capacitor can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 27A to 30A are partial cross sectional views at a memory device region illustrating the process of manufacturing the conventional semiconductor device shown in FIG. 26 in the order of the steps performed.

FIGS. 27B to 30B are partial cross sectional views at a peripheral circuit region illustrating the process of manufacturing the conventional semiconductor device shown in FIG. 26 in the order of the steps performed.

DESCRIPTION OF THE PREFERRED EMBODIMENTS

[Embodiment 1]

Figure 1:
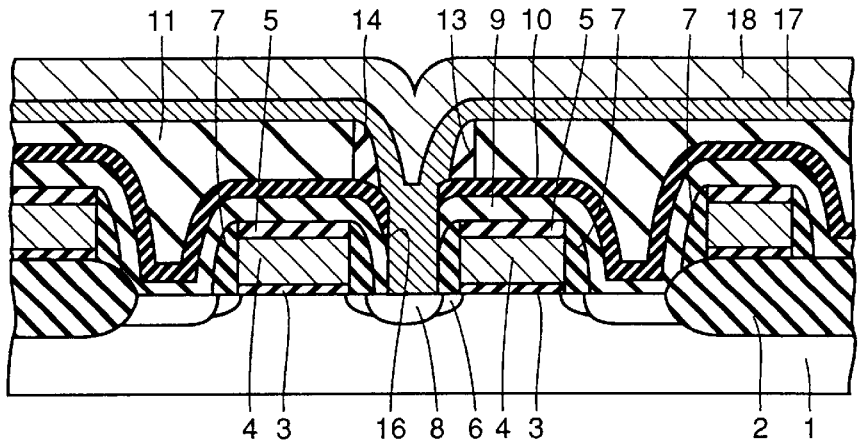
FIG. 1 is a partial cross sectional view showing a semiconductor device having a conductive layer contact structure according to Embodiment 1 of the present invention.

Referring to FIG. 1, an element isolating insulation film 2 of silicon oxide film is formed on the surface of a p type silicon substrate 1. A gate insulation film 3 of silicon oxide film is formed on the surface of p type silicon substrate 1 and on the surface of element isolating insulation film 2. A gate electrode 4 of polycrystalline silicon containing impurity is formed on gate insulation layer 3. On gate electrode 4, an insulation film 5 of silicon oxide film is formed. A sidewall spacer 7 is formed at the side surface of gate insulation film 3, gate electrode 4 and insulation film 5. An n⁻ diffused layer 6 is formed by LDD method, and contains n type impurity of low concentration. An n⁺ diffused layer 8 is formed at the surface of p type silicon substrate 1 so as to join n⁻ diffused layer 6. A silicon oxide film 9 of TEOS oxide film or the like is formed on the surface of p type silicon substrate 1 as an lower insulation layer of a first insulation layer to cover insulation film 5 and sidewall spacer 7. A silicon nitride film 10 is formed on silicon oxide film 9 as an upper insulation layer of the first insulation layer. A silicon oxide film 11 of TEOS oxide film or the like is formed on silicon nitride film 10 as a second insulation layer.

A hole 16 is formed to reach a portion of the surface of n⁺ diffused layer 8, being defined by the inner sidewall of silicon oxide film 9 and silicon nitride film 10. In addition, a hole 13 is formed, defined by the inner sidewall of silicon oxide film 11, and having a larger diameter than hole 16. Hole 13 is in communication with hole 16. A sidewall spacer 14 of TEOS oxide film is formed at the inner sidewall of silicon oxide film 11 defining hole 13. Through the contact hole formed in this way, a polycrystalline silicon layer 17 and a tungsten silicide layer 18 are formed inside contact hole 16 so as to be in contact with and in electrical connection with the surface of n⁺ diffused layer 8. Note that the diameter of hole 13 is about 0.3 μm and the diameter of contact hole 16 is about 0.2 μm.

Figure 32:
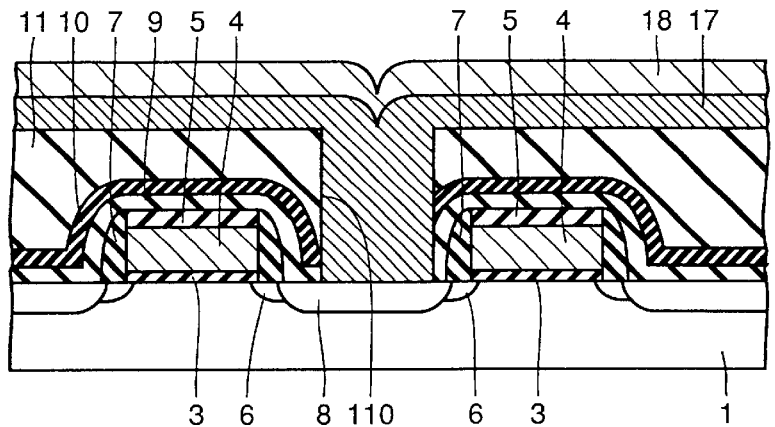
FIG. 32 is a partial cross sectional view showing a conventional semiconductor device having a contact hole formed by self align contact opening method.
Figure 33:
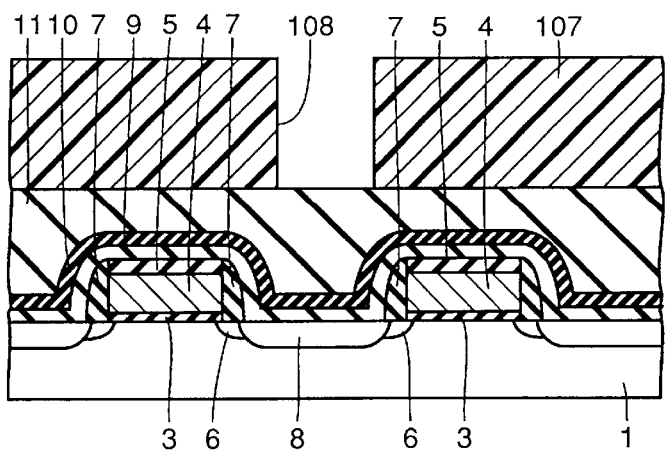
FIGS. 33 to 36 are partial cross sectional views illustrating the process of manufacturing the conventional semiconductor device shown in FIG. 32 in the order of the steps performed.
Figure 34:
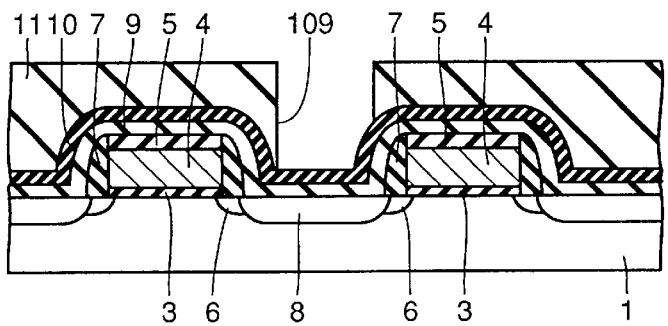
Figure 35:
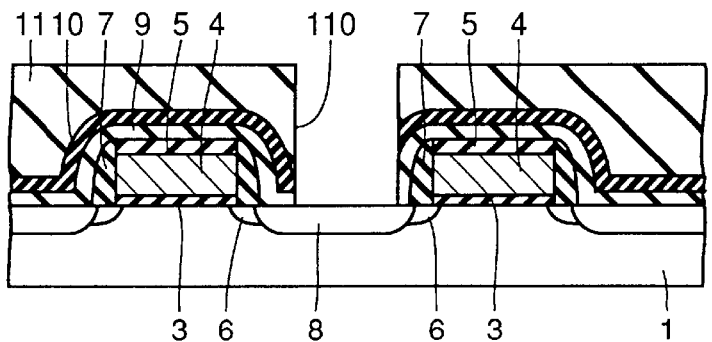
Figure 36:
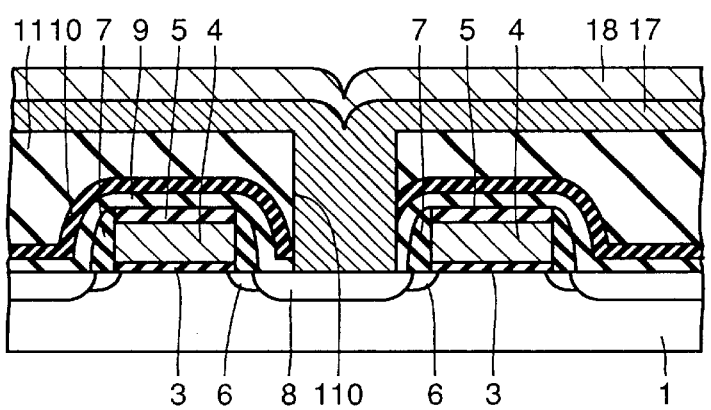
Figure 37:
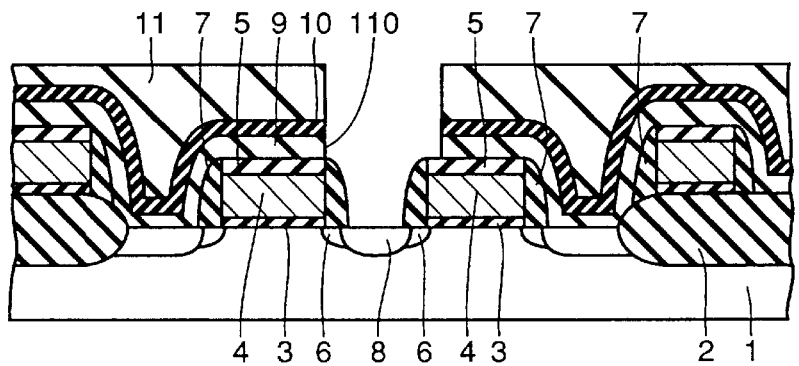
FIG. 37 is a partial cross sectional view showing another example of a conventional semiconductor device having a contact hole formed by self align contact opening method.
Figure 38:
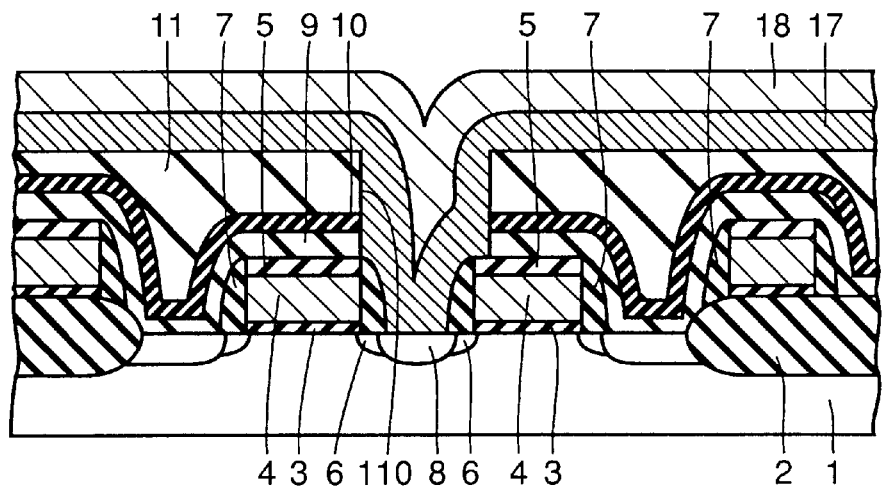
FIG. 38 is a partial cross sectional view showing the another example of a conventional semiconductor device in which an interconnection layer is formed at the contact hole shown in FIG. 37.
Figure 39:
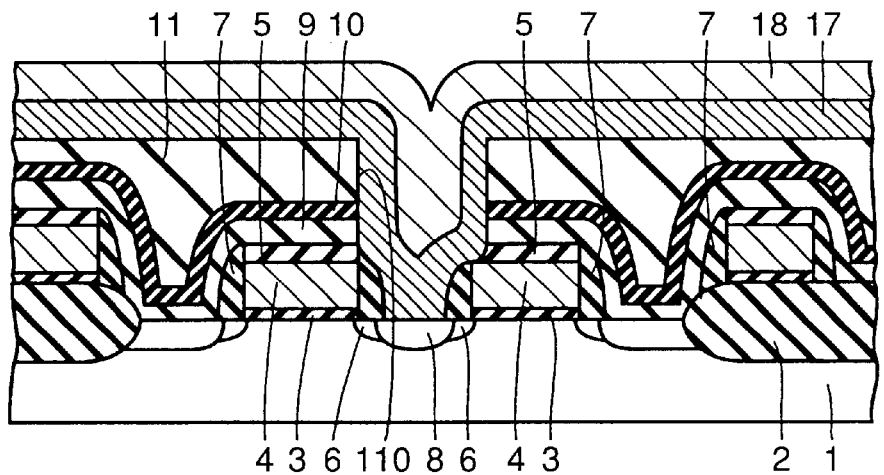
FIG. 39 is a partial cross sectional view for giving a description of the problems encountered in the conventional semiconductor device having a contact hole formed by self align contact opening method.

The conductive layer contact structure shown in FIG. 1 differs from the conventional structure by the self align contact opening method shown in FIG. 32 in following points. First of all, the size of the opening of silicon oxide film 9 and silicon nitride film 10, that is, the diameter of contact hole 16, is smaller than the size of the opening of silicon oxide film 11 provided as the interlayer insulation film, that is, the diameter of hole 13. In addition, sidewall spacer 14 is formed at the opening portion of silicon oxide film 11, that is, at the inner sidewall of silicon oxide film 11 defining hole 13. Other portions of the structure are similar to those of the conventional structure shown in FIG. 32.

Referring next to FIGS. 2 to 6, description is made for a method of manufacturing the conductive layer contact structure shown in FIG. 1.

Figure 2:
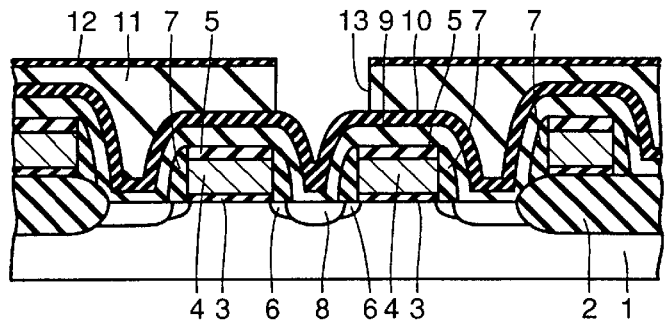
FIGS. 2 to 6 are partial cross sectional views illustrating the process of manufacturing the semiconductor device having the conductive layer contact structure shown in FIG. 1 in the order of the steps performed.

As shown in FIG. 2, element insulation film 2 of silicon oxide film having a thickness of 2500 Å is formed by LOCOS at the surface of p type silicon substrate 1 having a specific resistance of 10 Ωcm. Then, after formation of silicon oxide film having a thickness of 100 Å by thermal oxidation, a polycrystalline silicon layer of thickness of 1000 Å containing impurity is deposited, and an additional silicon oxide film having a thickness of 900 Å is formed on that polycrystalline silicon layer by CVD (Chemical Vapor Deposition) method. Thereafter, a resist is formed on the silicon oxide film of the upper layer, and by using the resist patterned with photolithography technique as a mask to perform etching, gate insulation film 3, gate electrode 4 and insulation film 5 are formed.

Then, by performing an ion implantation of arsenic with an implantation energy of 30 KeV, implantation amount of $1 \times 10^{14}$ and implantation angle of 45°, n⁻ diffused region 6 is formed at the surface of p type silicon substrate 1. Thereafter, by depositing a silicon oxide film of TEOS oxide film or the like on the entire surface and etching back this silicon oxide film, a sidewall spacer 7 is formed. By performing an ion implantation of arsenic with an implantation energy of 50 KeV, implantation amount of $4 \times 10^{15}$/cm² and implantation angle of 0°, n⁺ diffused layer 8 is formed on the surface of p type silicon substrate 1.

Thereafter, silicon oxide film 9 of TEOS oxide film or the like is formed as the lower insulation layer of the first insulation layer by being deposited with CVD method to a thickness of 300 Å. In addition, silicon nitride film 10 having a thickness of 800Å is formed as the upper insulation layer of the first insulation layer on silicon oxide film 9 by being deposited by CVD method. Then, silicon oxide film 11 of TEOS oxide film or the like is deposited to a thickness of 3000 to 5000 Å as the second insulation layer. An anti-reflection film 12 formed of silicon nitride film having a thickness of 500 Å is deposited on silicon oxide film 11. A resist is formed on the surface of this anti-reflection film 12 and the resist which is patterned by photolithography technique is used as a mask to pattern anti-reflection film 12. With use of an etching process of silicon dioxide which is of a faster etching rate than silicon nitride film 10 as the upper insulation layer, silicon oxide film 11 as the second insulation layer is dry etched by the method of RIE (Reactive Ion Etching) so as to open hole 13. This etching process is performed under a condition that the etching selectivity of silicon oxide film 11 as the second insulation layer would be higher with respect to silicon nitride film 10 as the upper insulation layer of the first insulation layer.

The process adopted as the etching process as described above may be a dry etching process employing, for example, fluorocarbon group gas such as c-$C_4F_8$, $C_3F_8$, $C_3F_6$, $C_5F_{12}$, $C_4F_8$, $C_5F_{10}$ or $CHF_3$, a mixed gas thereof, a mixed gas of argon (Ar), carbon monoxide (CO), oxide (O) or the like and the fluorocarbon group gas, or mixed gas of argon (Ar), carbon monoxide (CO), oxide (O) or the like and the above-described mixed gas of fluorocarbon group gases. Preferably, etching process of silicon oxide film is performed with mixed gas of $CF_4$, $CHF_3$ or the like and Ar or $O_2$. In such an etching process, the etching selectivity (silicon oxide film/silicon nitride film) is not lower than 5, and preferably in the range of 7 to 10. Here, the term etching selectivity refers to the ratio between the etching rate of the material to be etched (silicon oxide film in this case) and the etching rate of the material of the layer underneath (silicon nitride film in this case).

Figure 3:
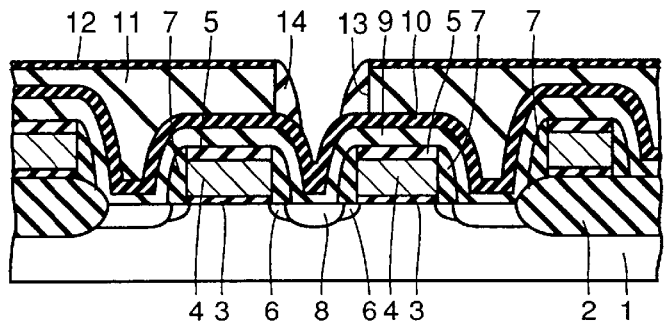

Then, as shown in FIG. 3, a TEOS oxide film having an etching selectivity sufficiently high with respect to silicon nitride film 10 is deposited on the entire surface. By etching back the entire surface of this TEOS oxide film, sidewall spacer 14 is formed at the inner sidewall of silicon oxide film 11.

Figure 4:
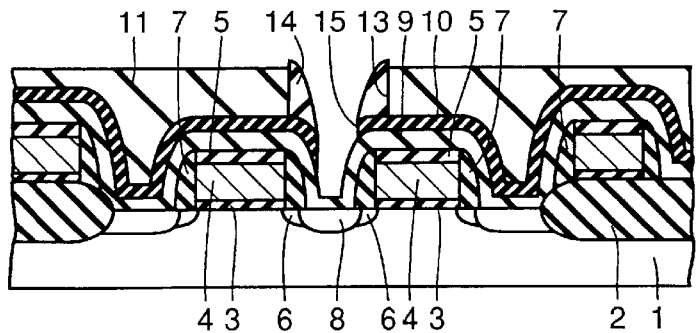

Then, as shown in FIG. 4, sidewall spacer 14 is used as a mask to dry etch silicon nitride film 10 by RIE method employing, for example, carbon tetrafluoride ($CF_4$) gas thereby forming hole 15. At this time, anti-reflection film 12 which is the silicon nitride film is removed simultaneously.

Figure 5:
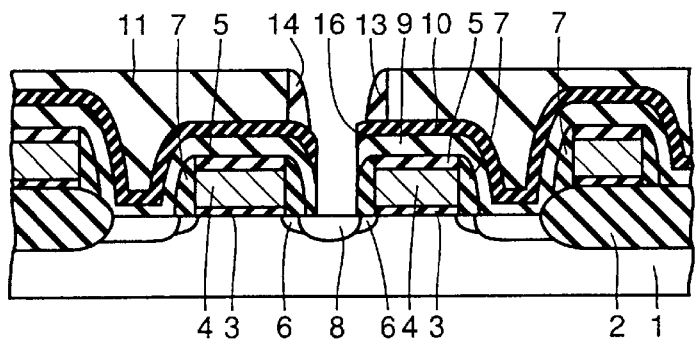

Thereafter, as shown in FIG. 5, using silicon nitride film 10 as a mask, silicon oxide film 9 of TEOS oxide film or the like is subjected to dry etching by RIE method to form contact hole 16. In this case, silicon oxide film 11 and sidewall spacer 14 are also slightly etched away.

The reason for forming silicon oxide film 9 as the lower insulation layer of the first insulation layer under silicon nitride film 10 as the upper insulation layer of the first insulation layer is as follows. If silicon nitride film 10 is formed directly on silicon substrate 1, there is a possibility of imposing damage to the surface of silicon substrate 1 which induces defects in crystal when removing silicon nitride film 10 by dry etching with carbon tetrafluoride gas. When silicon oxide film 9 is formed between silicon substrate 1 and silicon nitride film 10, there would be no damage to silicon substrate, upon dry etching silicon nitride film 10.

Figure 6:
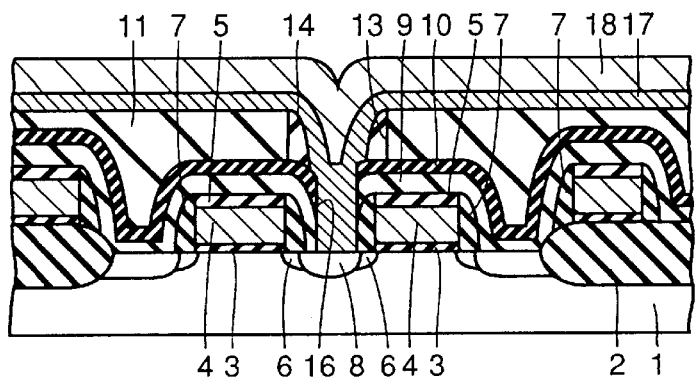

Finally, as shown in FIG. 6, polycrystalline silicon layer 17 having a thickness of 500 to 1000 Å and tungsten silicide layer having a thickness of 500 to 1000 Å are formed as a conductive layer on silicon oxide film 11 of TEOS or the like and inside the contact hole 16. In this way, the conductive layer is brought into contact and is electrically connected with $n^+$ diffused layer via contact hole 16. Thus, the conductive layer contact structure shown in FIG. 1 is formed.

As described above, according to the semiconductor device and manufacturing method thereof, since self align contact opening method is employed as the basic method, etching is performed without involving a high etching ratio such that the conductive layer would not be electrically short-circuited with gate electrode at the peripheral circuit region, and thus a structure with a low contact resistance can be obtained. In addition, since sidewall spacer 14 is formed at the inner sidewall of the hole of silicon oxide film 11 of TEOS or the like as the second insulation layer, a contact hole having a smaller diameter than the resolution of photolithography technique can be formed in a stabilized manner with desired dimension without conductive layer and the gate electrode being electrically short-circuited at memory device region as well. A semiconductor device with a structure having a satisfactory step coverage of the conductive layer at contact hole 16 can be implemented.

In the above Embodiment 1, description has been made for the case in which thickness of silicon oxide film 9 of TEOS or the like forming the lower insulation layer of the first insulation layer is 300Å, but this silicon oxide film 9 may be of any thickness as long as it does not exceed 500 Å. Although the case in which the thickness of silicon nitride film 10 forming the upper insulation layer of the first insulation layer is 800Å has been described, this thickness may also be of any value in the range of 100 to 1000 Å. In addition, gate electrode 4 may be formed not only of polycrystalline silicon layer containing impurity but of silicide film, metal film or stacked film including them.

Insulation film 5 may also be of silicon nitride film or silicon oxynitride film instead of silicon oxide film, or of stacked film including them. In addition, sidewall spacer 7 may be formed not only of silicon oxide film but of silicon oxide film, silicon oxynitride film or stacked film including them. It may be noted that formation of sidewall spacer 7 is not indispensable. Although the example employing TEOS oxide film as the second insulation layer 11 has been shown, another material BPTEOS (Boro Phospho Tetraethyl Orthosilicate) may also form a silicon oxide film (hereinafter referred to as "BPTEOS oxide film") to be employed, or a stacked film of TEOS oxide film and BPTEOS oxide film may be employed to form the layer. Sidewall spacer 14 may be formed of a polycrystalline silicon film instead of TEOS oxide film. In addition, it may not be always necessary to form insulation film 5 and silicon oxide film 9 as the lower insulation layer of the first insulation layer, and alternatively, it may be formed of a stacked film including two layers or more. An effect similar to what was described above is achieved in this case also. As has been described above, if the possibility of imposing damage to the surface of silicon substrate 1 may be withdrawn from consideration, formation of silicon oxide film 9 is unnecessary.

In the case described in the above Embodiment 1, the location of the hole of silicon oxide film 11 as the second insulation layer and the location of gate electrode 4 underneath were overlapped, but even in the case in which the gate electrodes underneath are provided with a wide interval therebetween and the location of the hole of silicon oxide film 11 does not overlap the gate electrode underneath, an effect is obtained in which alignment margin upon forming the contact hole is improved in accordance with the present invention as compared to the conventional self align contact opening method.

[Embodiment 2]

Figure 7:
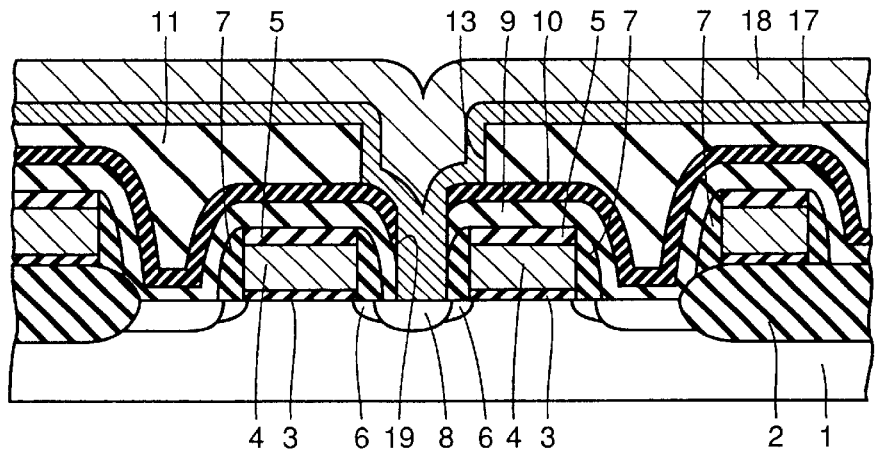
FIG. 7 is a partial cross sectional view showing a semiconductor device having a conductive layer contact structure according to Embodiment 2 of the present invention.

Sidewall spacer 14 was left inside contact hole 16 in the above Embodiment 1, but in this Embodiment 2 a sidewall spacer 14 is not left inside contact hole 19, as can be seen with reference to FIG. 7. The other portions of the structure are similar to those of the structure of Embodiment 1 shown in FIG. 1.

Referring next to FIGS. 8 to 13, a method of manufacturing the semiconductor device shown in FIG. 7 will be described.

Figure 8:
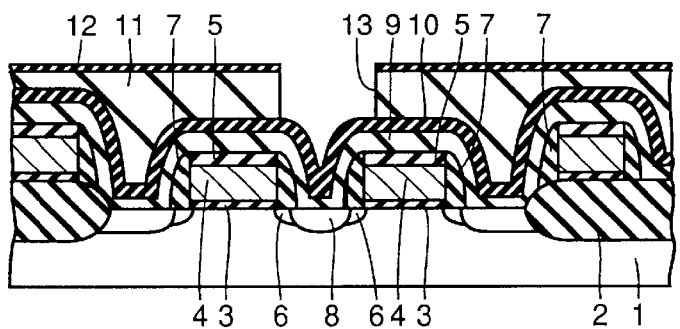
FIGS. 8 to 13 are partial cross sectional views illustrating the process of manufacturing the semiconductor device having the conductive layer contact structure shown in FIG. 7 in the order of the steps performed.

Referring first to FIG. 8, a hole 13 is formed by a manufacturing process similar to that of above-described Embodiment 1.

Figure 9:
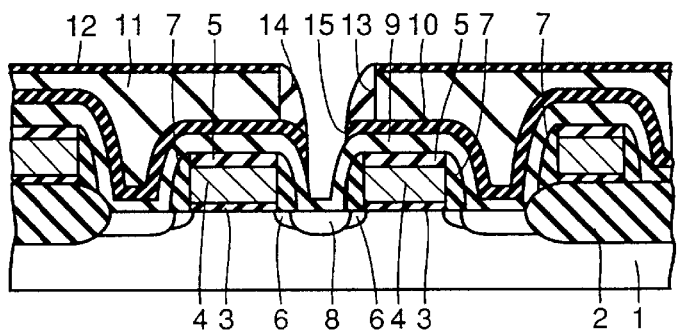

Thereafter, as shown in FIG. 9, a BPTEOS oxide film having a sufficiently high etching selectivity with respect to silicon nitride film 10 as an upper insulation layer of the first insulation layer and having a high etching selectivity, that is, a different etching rate, with respect to silicon oxide film 11 of TEOS or the like as the second insulation layer is deposited on the entire surface. By etching back the entire surface of this BPTEOS oxide film, sidewall spacer 14 is formed at the inner sidewall of silicon oxide film 11.

Figure 10:
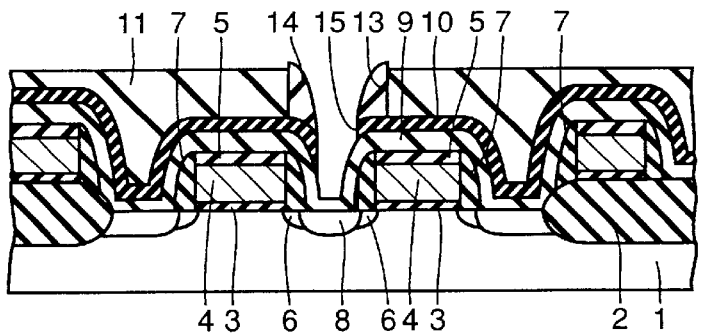

Then, as shown in FIG. 10, using sidewall spacer 14 as a mask, silicon nitride film 10 is dry etched by RIE method employing, for example, carbon tetrafluoride ($CF_4$) gas so as to form a hole 15. At this time, an anti-reflection film 12 which is a silicon nitride film is also removed simultaneously.

Figure 11:
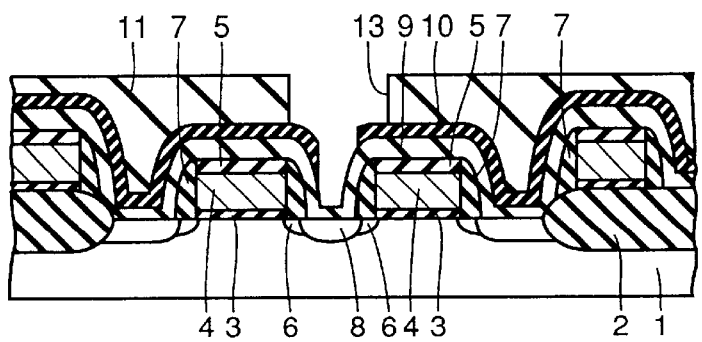
Figure 12:
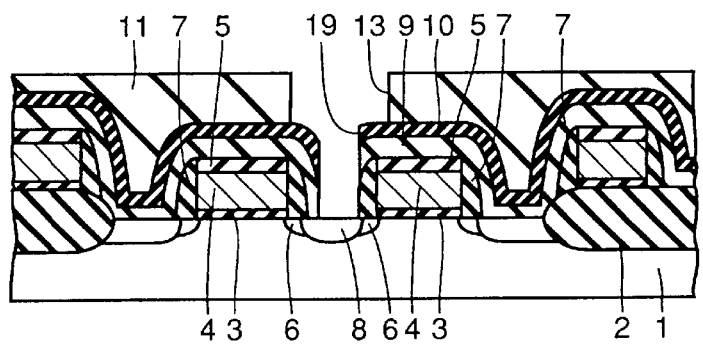

Then, as shown in FIG. 11, only the sidewall spacer 14 formed of BPTEOS oxide film is etched away under a vapor hydrofluoric acid atmosphere to have a large etching selectivity with respect to silicon oxide film 11.

Thereafter, as shown in 12, silicon nitride film 10 is used as a mask to dry etch silicon oxide film 9 of TEOS or the like by RIE method so as to form a contact hole 19. At this time, silicon oxide film 11 is also slightly etched away.

Here, the reason for forming silicon oxide film 9 as the lower insulation layer of the first insulation layer under silicon nitride film 10 as the upper insulation layer of the first insulation layer is similar to the reason in the description of Embodiment 1.

Figure 13:
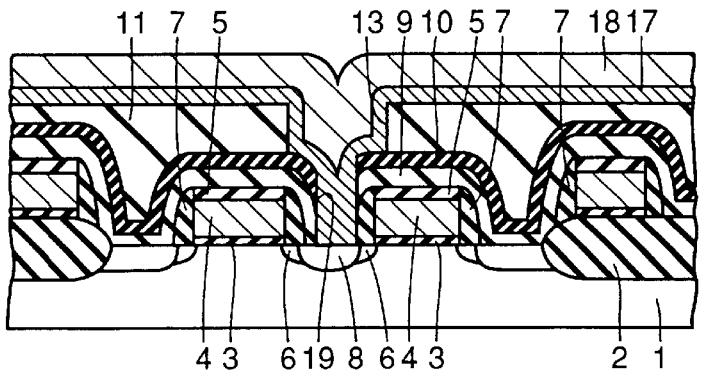

Finally, as shown in FIG. 13, polycrystalline silicon layer 17 and tungsten silicide layer 18 are formed as conductive layers on silicon oxide film 11 of TEOS or the like and inside contact hole 19. In this way, the conductive layer is brought into contact and is electrically connected with $n^+$ diffused region 9. Thus, the semiconductor device as shown in FIG. 7 is formed.

As has been described above, according to the conductive layer contact structure of this Embodiment 2 and the method of manufacturing the same, since self align contact opening method is employed as the basic method, etching is performed without involving a high etching ratio such that the conductive layer would not be electrically short-circuited with gate electrode at the peripheral circuit region, and thus a conductive layer contact structure with a low contact resistance can be obtained. Particularly, since sidewall spacer 14 is removed in the end at contact hole 19 of Embodiment 2, a conductive layer contact structure having a lower contact resistance than the structure employing contact hole 16 of Embodiment 1. In addition, since silicon nitride film 10 is removed after formation of sidewall spacer 14 at the inner sidewall defining the hole of silicon oxide film 11, a contact hole having a smaller diameter than the resolution of photolithography technique can be formed in a stabilized manner with desired dimension. In addition, a structure in which conductive layer would not be electrically short-circuited with gate electrode 4 also at the memory device region can be obtained. Moreover, a structure having a satisfactory step coverage of the conductive layer at contact hole 19 can be implemented.

In the above Embodiment 2, description has been made for the case in which thickness of silicon oxide film 9 of TEOS or the like forming the lower insulation layer of the first insulation layer is 300 Å, but this silicon oxide film 9 may be of any thickness as long as it does not exceed 500 Å. Although the case in which the thickness of silicon oxide film 10 forming the upper insulation layer of the first insulation layer is 800 Å has been described, this thickness may also be of any value in the range of 100 to 1000 Å. In addition, gate electrode 4 may be formed not only of polycrystalline silicon layer containing impurity but of silicide film, metal film or a stacked film including them.

Insulation film 5 may also be of silicon nitride film or silicon oxynitride film instead of silicon oxide film, or of stacked film including them. In addition, sidewall spacer 7 may be formed not only of silicon oxide film but of silicon nitride film, silicon oxynitride film or a stacked film including them. It may be noted that formation of sidewall spacer 7 is not indispensable. Moreover, second insulation layer 11 may be formed of BPTEOS oxide film instead of TEOS oxide film or of a stacked film including TEOS oxide film and BPTEOS oxide film. Sidewall spacer 14 may be formed of a polycrystalline silicon film instead of BPTEOS oxide film. In addition, it may not be always necessary to form insulation film 5 and silicon oxide film 9 as the lower insulation layer of the first insulation layer, and alternatively, it may be formed of a stacked film including two layers or more. An effect similar to that of the above-described Embodiment 2 is achieved in this case also. As has been described above, if the possibility of imposing damage to the surface of silicon substrate 1 may be withdrawn from consideration, formation of silicon oxide film 9 is not indispensable.

In the case described in the above Embodiment 2, the location of the hole of silicon oxide film 11 and the location of the gate electrode 4 below were overlapped, but even in the case in which the gate electrodes below are provided with a wide interval therebetween and the location of the hole of silicon oxide film 11 does not overlap the location of gate electrode 4 below, an effect is obtained in which alignment margin upon forming the contact hole is improved in accordance with the present invention as compared to the conventional self align contact opening method.

[Embodiment 3]

Figure 14:
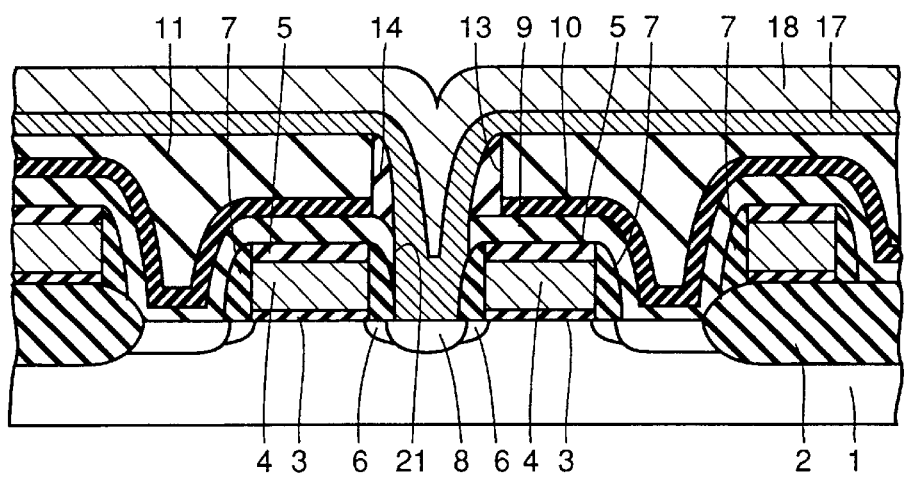
FIG. 14 is a partial cross sectional view showing a semiconductor device having a conductive layer contact structure according to Embodiment 3 of the present invention.

The sidewall spacer was formed at the inner sidewall defining the hole of silicon oxide film 11 of TEOS or the like in Embodiment 1, but in Embodiment 3, the size of the hole of silicon nitride film 10 as an upper insulation layer of the first insulation layer is substantially the same as the size of the hole of silicon oxide film 11 as the second insulation layer, and sidewall spacer 14 is formed along the inner sidewall defining the hole of silicon oxide film 11 and the inner sidewall defining the hole of silicon nitride film 10, as shown in FIG. 14. In addition, silicon nitride film 10 is not exposed at the inner sidewall of sidewall spacer 14 and the inner sidewall of silicon nitride film 10 is covered with sidewall spacer 14. Other portions of the structure is similar to those of Embodiment 1 shown in FIG. 1.

Referring next to FIGS. 15 to 19, a manufacturing method of the semiconductor device shown in FIG. 14 will be described.

Figure 15:
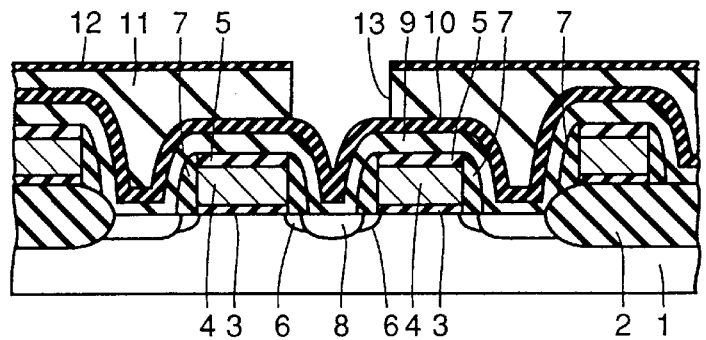
FIGS. 15 to 19 are partial cross sectional views illustrating the process of manufacturing the semiconductor device having the conductive layer contact structure shown in FIG. 14 in the order of the steps performed.

Referring first to FIG. 15, a hole 13 is formed through a process similar to that of Embodiment 1.

Figure 16:
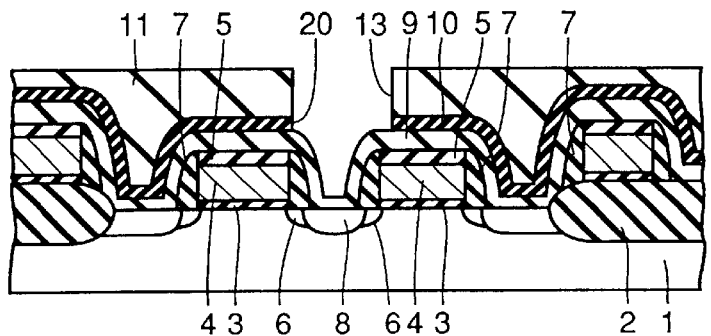

Then, as shown in FIG. 16, a silicon nitride film 10 as an upper insulation layer of a first insulation layer is subjected to dry etching by an RIE method using a resist mask (not shown) employed for formation of hole 13 and with an alternative etching gas such as, for example, carbon tetrafluoride ($CF_4$) gas, so as to form a hole 20. When etching silicon nitride film 10 with $CF_4$ gas, the etching selectivity (silicon nitride film/silicon oxide film) is not lower than 1 and not higher than 3. In this case, the etching selectivity is expressed as the ratio between the etching rate of silicon nitride film 10 as the material to be etched and the etching rate of silicon oxide film 9 as the material of the layer underneath. Then, after removal of the resist, anti-reflection film 12 which is the silicon nitride film is removed.

Figure 17:
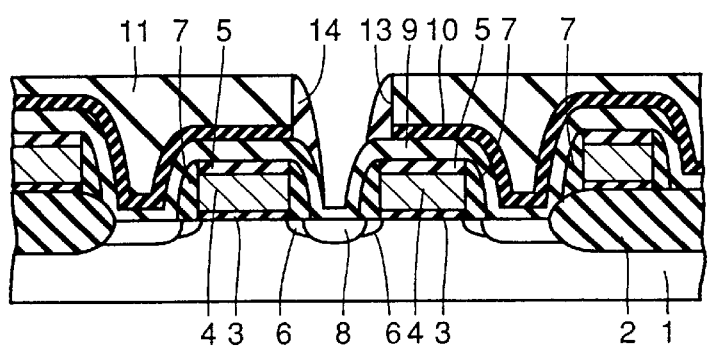

Thereafter, as shown in FIG. 17, TEOS oxide film is deposited entirely on the surface to a thickness of 1500 Å, and by etching back the entire surface of this TEOS oxide film, a sidewall spacer 14 is formed along the inner sidewall defining the hole of silicon oxide film 11 and the inner sidewall defining the hole of silicon nitride film 10. At this time, sidewall spacer 14 is formed from an insulation film, and accordingly, even when gate electrode 4 is exposed in the previous steps, this exposed portion would be covered with sidewall spacer 14 such that the conductive layer formed within the contact hole in the following steps would not be in contact with gate electrode 4 to be electrically short-circuited.

Figure 18:
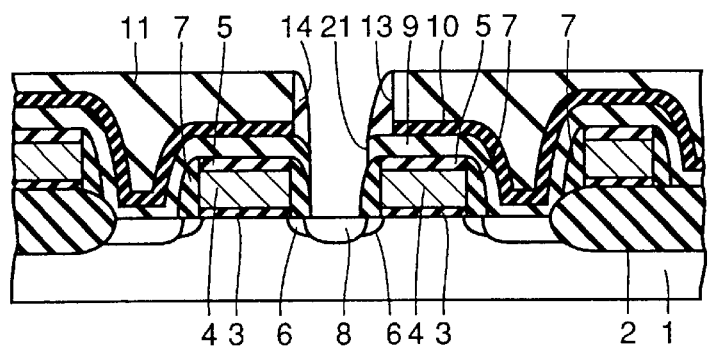

Then, as shown in FIG. 18, silicon oxide film 9 of TEOS or the like is dry etched with the etching controlled to expose the surface of silicon substrate 1 by RIE method so as to form a contact hole 21.

Figure 19:
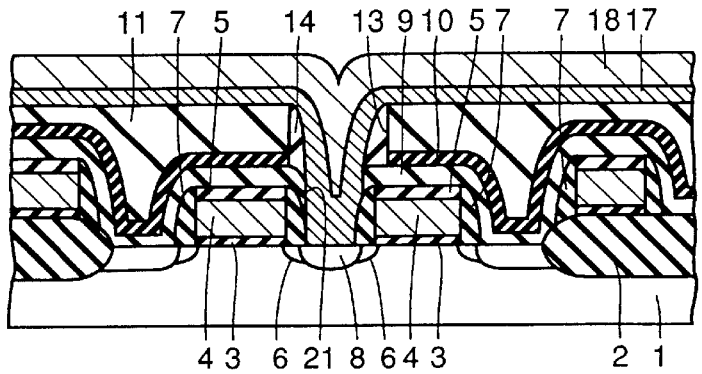

Finally, as shown in FIG. 19, a polycrystalline silicon layer 17 and a tungsten silicide layer 18 are formed as conductive layers on silicon oxide film 11 of TEOS or the like and within contact hole 21. Thus, the conductive layer will be electrically connected to $n^+$ diffused layer 8 via contact hole 21, and the conductive layer contact structure as shown in FIG. 14 is formed.

As described above, according to the conductive layer contact structure of Embodiment 3 and manufacturing method thereof, the self align contact opening method is employed as the basic method so that the conductive layer would not be short-circuited with gate electrode in the peripheral circuit region, such that a structure having a low contact resistance can be obtained due to an etching with an aspect ratio not so high. In Embodiment 1, silicon nitride film 10 as the upper insulation layer of the first insulation layer is used as a mask to dry etch silicon oxide film 9 of TEOS oxide film or the like as the lower insulation layer of the first insulation layer by RIE method as shown in FIG. 5, so as to from contact hole 16. At this time, sidewall spacer 14 may also be more or less subjected to etching such that there would be difference in level at the border of sidewall spacer 14 and silicon nitride film 10. On the contrary, in Embodiment 3, sidewall spacer 14 is formed along the inner sidewall defining the hole of silicon oxide film 11 of TEOS or the like as the second insulation layer and the inner sidewall defining the hole of silicon nitride film 10 as the upper insulation layer of the first insulation layer so that silicon nitride film 10 would not be exposed to the inner sidewall of sidewall spacer 14. Accordingly, contact hole 21 would be tapered forward, in other words, would have its diameter smoothly increased as it extends upwards from the surface of silicon substrate 1, and the step coverage of the conductive layer would be better than in contact hole 16 of Embodiment 1. In addition, a contact hole having a diameter smaller than the resolution of photolithography technique can be formed to have a desired size in a stabilized manner. Short-circuit between the conductive layer and the gate electrode will not occur at the memory device region also, and a small contact hole can be formed.

In addition, in the above-described Embodiment 3, the case in which the thickness of silicon oxide film 9 of TEOS or the like as the lower insulation layer of the first insulation layer is 300 Å, but this thickness may be of any value as long as it falls in the range of 50 to 500 Å. Although the thickness of silicon nitride film 10 as the upper insulation layer of the first insulation layer is 800 Å in the above description, this film thickness may be of any value as long as it is in the range of 100 to 1000 Å. Moreover, the gate electrode may be formed not only of polycrystalline silicon layer containing impurity but of a silicide film, a metal film or a stacked film including these films.

Insulation film 5 may also be of silicon nitride film or silicon oxynitride film instead of silicon oxide film, or of stacked film including them. In addition, sidewall spacer 7 may be formed not only of silicon oxide film but of silicon nitride film, silicon oxynitride film or stacked film including them. Formation of sidewall spacer is not indispensable. In addition, the second insulation layer 11 may be formed of BPTEOS oxide film instead of TEOS oxide film, or of a stacked film including TEOS and BPTEOS oxide films. Sidewall spacer 14 may be formed of polycrystalline silicon film instead of TEOS oxide film. Note that formation of insulation film 5 is not always necessary, and that it may be formed of a stacked film including two layers or more. An effect similar to that of the above-described Embodiment 3 can be obtained in this case also.

In the case described in the above Embodiment 3, the location of the hole of silicon oxide film 11 and the location of the gate electrode 4 below were overlapped, but even in the case in which the gate electrodes below are provided with a wide interval therebetween and the location of the hole of silicon oxide film 11 does not overlap the location of gate electrode 4 below, an effect is obtained in which alignment margin upon forming the contact hole is improved in accordance with the present invention as compared to the conventional self align contact opening method.

[Embodiment 4]

Figure 20:
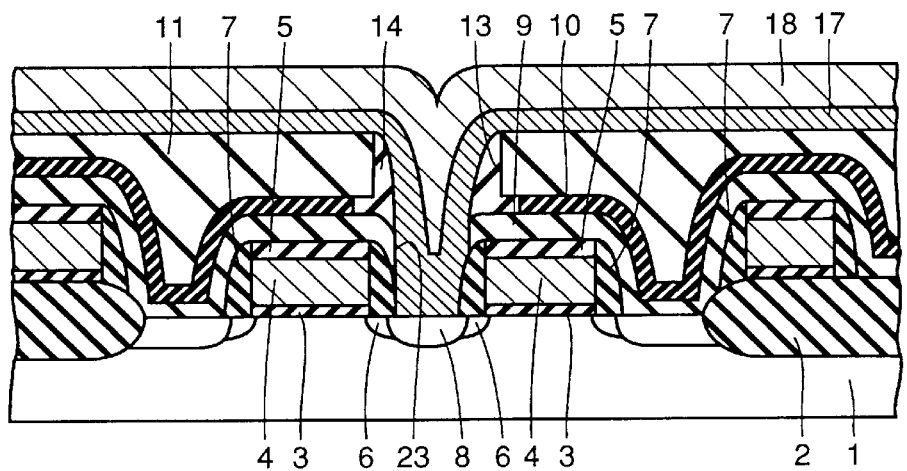
FIG. 20 is a partial cross sectional view showing a semiconductor device having a conductive layer contact structure according to Embodiment 4 of the present invention.

As can be seen from FIG. 20, the difference between the contact structure of Embodiment 3 in FIG. 14 and the structure of the present embodiment is that the hole of silicon nitride film 10 as an upper insulation layer of the first insulation layer is formed larger than the hole of silicon oxide film 11 of TEOS or the like as the second insulation layer. Other portions of the structure are similar to those of the Embodiment 3 shown in FIG. 14.

Referring next to FIGS. 21 to 25, a method of manufacturing the semiconductor device shown in FIG. 20 will be described.

Figure 21:
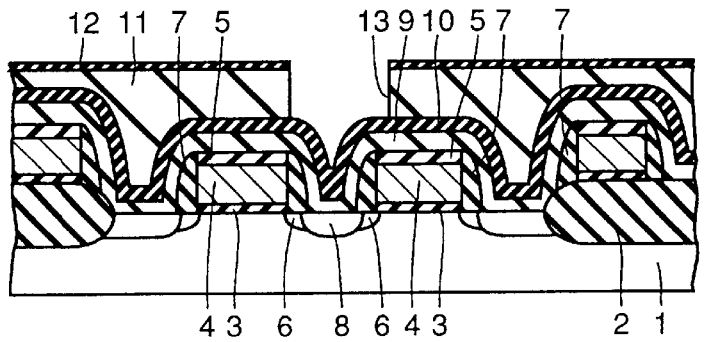
FIGS. 21 to 25 are partial cross sectional views illustrating the process of manufacturing the semiconductor device having the conductive layer contact structure shown in FIG. 20 in the order of the steps performed.

Referring first to FIG. 21, a contact hole 13 is formed through a process similar to that of Embodiment 1.

Figure 22:
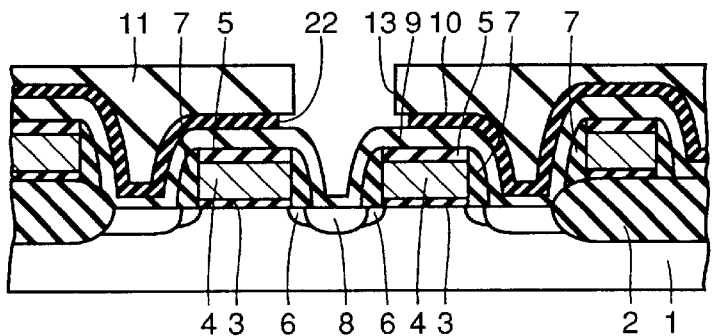

Then, as shown in FIG. 22, a hole 22 is opened by etching silicon nitride film 10 by wet etching employing heated phosphoric acid after removing the resist. At this time, anti-reflection film 12 which is the silicon nitride film is also removed. With wet etching performed in this way, there would be no plasma damage upon the dry etching. In addition, there is an advantage that silicon nitride film 10 is etched away such that it will have a high etching selectivity with respect to silicon oxide film 11 as the second insulation layer and silicon oxide layer 9 as the lower insulation layer of the first insulation layer. The etching selectivity (silicon nitride film/silicon oxide film) when silicon nitride film is wet etched with heated phosphoric acid is 4 or higher. Here, the etching selectivity is expressed as the ratio between the etching rate of silicon nitride film as the material to be etched and the etching rate of the silicon oxide film as the material of the layer underneath.

Figure 23:
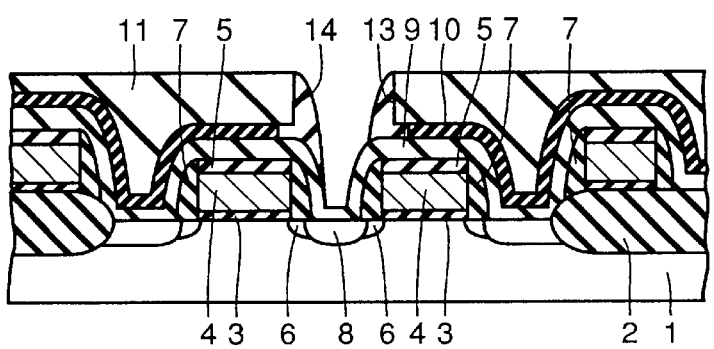

Then, as shown in FIG. 23, a TEOS oxide film is deposited on the entire surface to a thickness of 1500 Å. By etching back the entire surface of this TEOS oxide film, a sidewall spacer 14 is formed along the inner sidewall defining the hole of silicon oxide film 11 of TEOS or the like and inner sidewall defining the hole of silicon nitride film 10. At this time, sidewall spacer 14 is formed from insulation film, and accordingly, even when gate electrode 4 is exposed during the previous steps, the exposed portion is covered with this sidewall spacer 14 such that the conductive layer formed within the contact hole in the following steps would not be electrically short-circuited with gate electrode 4.

Figure 24:
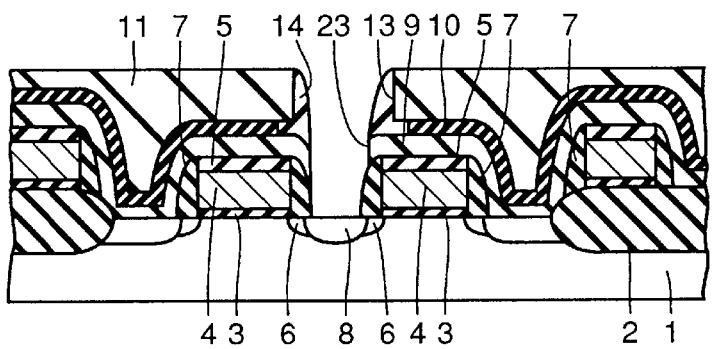

Then, as shown in FIG. 24, silicon oxide film 9 of TEOS or the like is removed by wet etching using diluted hydrofluoric acid and a contact hole 23 is formed. Then, the possibility of damage on the surface of silicon substrate 1 is reduced. If the possibility of imposing damage to the surface of silicon substrate 1 may be withdrawn from consideration, silicon oxide film 9 may be removed by dry etching.

Figure 25:
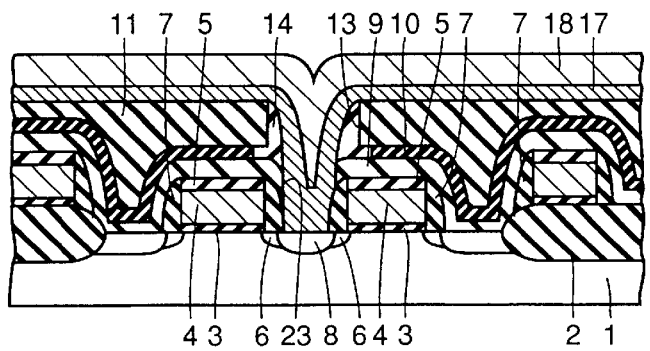
Figure 26:
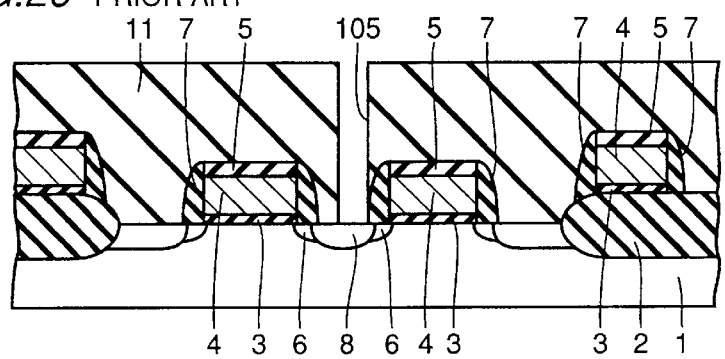
FIG. 26 is a partial cross sectional view showing a conventional semiconductor device having a contact hole formed by polycrystalline silicon mask opening method.
Figure 27A:
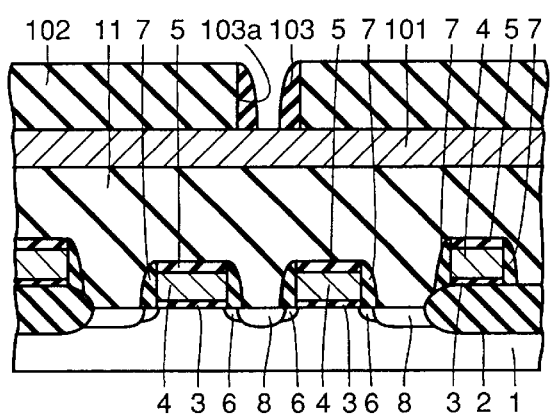
Figure 27B:
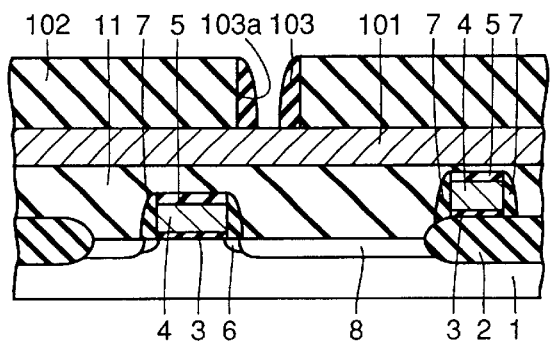
Figure 28A:
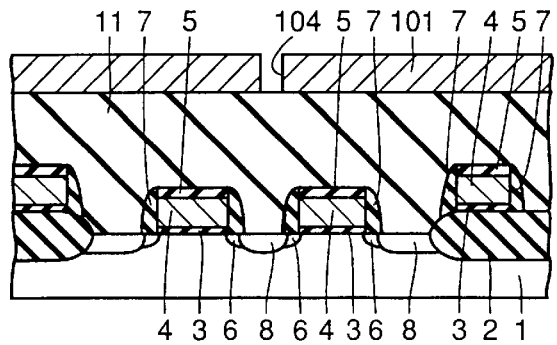
Figure 28B:
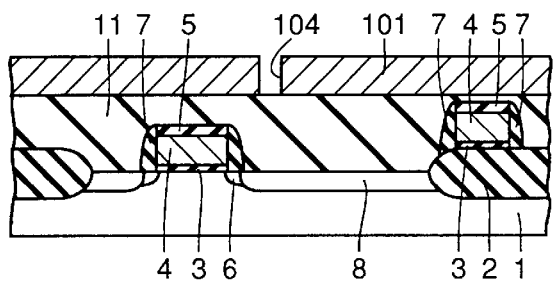
Figure 29A:
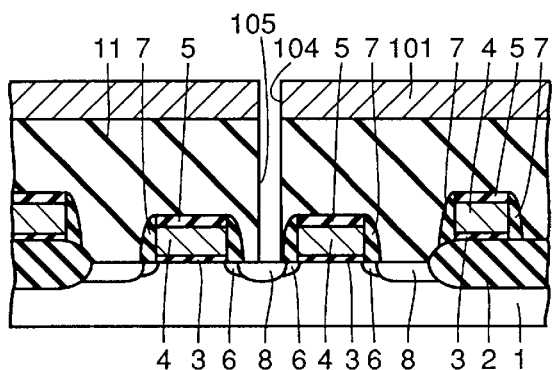
Figure 29B:
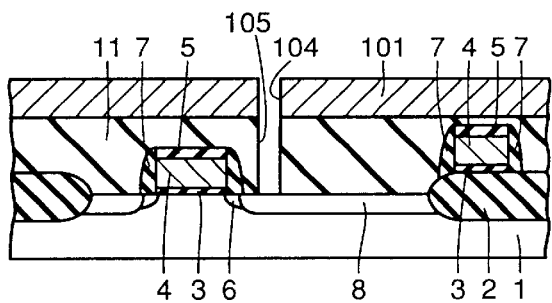
Figure 30A:
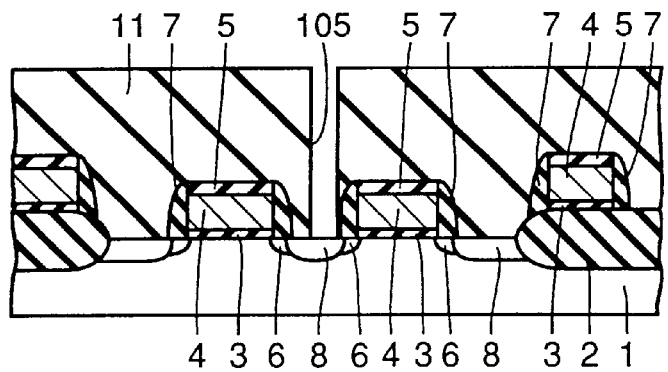
Figure 30B:
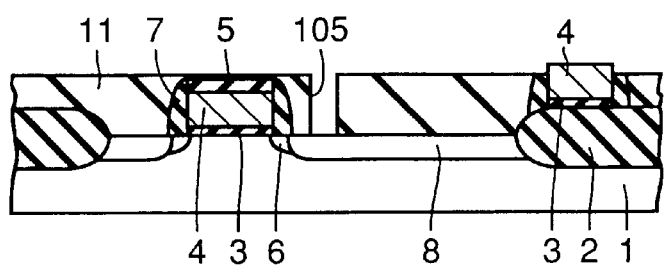
Figure 31:
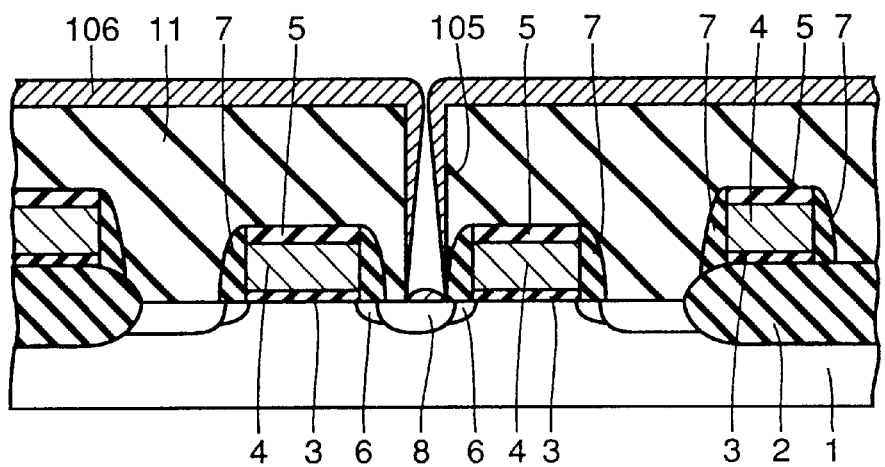
FIG. 31 is a partial cross sectional view for giving a description of the problems encountered in the conventional semiconductor device having a contact hole formed by polycrystalline silicon mask opening method.

Finally, as shown in FIG. 25, polycrystalline silicon layer 17 and tungsten silicide layer 18 are formed as conductive layers on silicon oxide film 11 of TEOS or the like and within contact hole 23. Thus, by connecting the conductive layer to $n^+$ diffused layer 8 electrically via contact hole 23, the conductive layer contact structure shown in FIG. 20 is formed.

As has been described above, according to the conductive layer contact structure of Embodiment 4 and the method of manufacturing the same, since self align contact opening method is employed as the basic method, etching is performed without involving a high etching ratio such that the conductive layer would not be electrically short-circuited with gate electrode at the peripheral circuit region, and thus a structure with a low contact resistance can be obtained. In addition, since silicon nitride film 10 as the upper insulation layer of the first insulation layer is removed by wet etching, an etching process in which plasma damage owing to dry etching will not occur, and moreover, which has a high etching selectivity with respect to silicon oxide film 11 as the second insulation layer and silicon oxide film 9 as the lower insulation layer of the first insulation layer can be adopted.

Furthermore, in Embodiment 1, silicon nitride film 10 as the upper insulation layer of the first insulation layer is used as a mask to dry etch silicon oxide film 9 of TEOS or the like as the lower insulation layer of the first insulation layer by RIE method to form contact hole 16, as shown in FIG. 5. At this time sidewall spacer 14 is also more or less subjected to etching such that there would be difference in level at the border portion between sidewall spacer 14 and silicon nitride film 10. On the contrary, in Embodiment 4, sidewall spacer 14 is formed along the inner sidewall defining the hole of silicon oxide film 11 and inner sidewall defining the hole of silicon nitride film 10 so that silicon nitride film 10 would not be exposed to the inner sidewall of sidewall spacer 14. Accordingly, contact hole 23 would be tapered forward, in other words, would have its diameter smoothly increased as it extends upwards from the surface of silicon substrate 1. As a result, the step coverage of the conductive layer formed along contact hole 23 is made better as compared to contact hole 16 of Embodiment 1. In addition, a contact hole smaller than the resolution of photolithography technique can be formed to be of a desired size in a stabilized manner. The small contact hole is formed so that the conductive layer will not be short-circuited with gate electrode 4 at the memory device region also.

In the above-described Embodiment 4, the case in which the thickness of silicon oxide film 9 of TEOS or the like as the lower layer of the first insulation layer is 300 Å, but this thickness may be of any value as long as it falls in the range of 50 to 500 Å. Although the thickness of silicon nitride film 10 as the upper insulation layer of the first insulation layer is 800 Å in the above description, this film thickness may be of any value as long as it is in the range of 100 to 1000 Å. Moreover, the gate electrode 4 may be formed not only of polycrystalline silicon layer containing impurity but also of a silicide film, a metal film or a stacked film including these films.

Insulation film 5 may also be of silicon nitride film or silicon oxynitride film instead of silicon oxide film, or of stacked film including them. In addition, sidewall spacer 7 may be formed not only of silicon oxide film but of silicon nitride film, silicon oxynitride film or stacked film including them. Formation of sidewall spacer is not indispensable. In addition, the second insulation layer 11 my be formed of BPTEOS oxide film instead of TEOS oxide film, or of a stacked film including TEOS and BPTEOS oxide films. Sidewall spacer 14 may be formed of polycrystalline silicon film instead of TEOS oxide film. Note that formation of insulation film 5 is not always necessary, and that it may be formed of a stacked film including two layers or more. An effect similar to that of the above-described Embodiment 4 can be obtained in this case also.

In the case described in the above Embodiment 4, the location of the hole of silicon oxide film 11 as the second insulation layer and the location of the gate electrode 4 below were overlapped, but even in the case in which the gate electrodes below are provided with a wide interval therebetween and the location of the hole of silicon oxide film 11 does not overlap the location of the gate electrode 4 below, an effect is obtained in which alignment margin upon forming the contact hole is improved in accordance with the present invention as compared to the conventional self align contact opening method.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A semiconductor device having a conductive contact layer structure, comprising:
   first conductive layers formed on a main surface of a semiconductor substrate with an insulating film therebetween;
   a conductive region formed under and between said first conductive layer extending into the semiconductor substrate from, and having a junction surface intersecting, the main surface of said semiconductor substrate;
   a first insulation layer formed over an upper surface of said first conductive layer, having two side surfaces, one of said side surfaces reaching a surface of said first conductive region and the other of said side surfaces not reaching said surface of said conductive region;
   a second insulation layer having side surfaces formed on said first insulation layer with a high etching selectivity with respect to said first insulation layer;
   a first hole defined by the one of said side surfaces of said first insulation layer that reaches said surface of said conductive region;
   a second hole defined by the side surfaces of said second insulation layer in communication with said first hole;
   a sidewall insulation film formed at an inner sidewall of said second insulation layer defining said second hole, wherein said sidewall insulation film does not extend on said side surface of said first insulation layer that defines said first hole; and
   a second conductive layer formed inside said first and second holes so as to be electrically connected to said conductive region and to be electrically insulated from said first conductive layer, wherein the side surfaces of the first insulation layer defining the first hole are not aligned with the junction surface of the conductive region and the semiconductor substrate.

2. The semiconductor device having a conductive layer contact structure according to claim 1, wherein said sidewall insulation film has a high etching selectivity with respect to said first insulation layer.

3. The semiconductor device having a conductive layer contact structure according to claim 1, wherein said first insulation layer includes upper and lower insulation layers, and said second insulation layer has a high etching selectivity with respect to the upper insulation layer of said first insulation layer.

4. The semiconductor device having a conductive layer contact structure according to claim 3, wherein said sidewall insulation film has a high etching selectivity with respect to the upper insulation layer of said first insulation layer.

5. The semiconductor device having a conductive layer contact structure according to claim 3, wherein said first hole is defined by the inner sidewall of the lower insulation layer of said first insulation layer while said second hole is defined by the inner sidewall of the upper insulation layer of said first insulation layer and the inner sidewall of said second insulation layer, said sidewall insulation film being formed at the inner sidewall of the upper insulation layer of said first insulation layer and the inner sidewall of said second insulation layer.

6. The semiconductor device having a conductive layer contact structure according to claim 5, wherein said second hole includes a third hole defined by the inner sidewall of the upper insulation layer of said first insulation layer and a fourth hole smaller than said third hole defined by the inner sidewall of said second insulation layer.

7. A semiconductor device having a conductive layer contact structure, comprising:

first conductive layers formed on a main surface of a semiconductor substrate with an insulating film therebetween;

a conductive region formed under and between said first conductive layer extending into the semiconductor substrate from, and having a junction surface intersecting, the main surface of said semiconductor substrate;

a first insulation layer formed over an upper surface of said first conductive layer, having two side surfaces, one of said side surfaces reaching a surface of said conductive region and the other of said side surfaces not reaching said surface of said conductive region;

a second insulation layer, having side surfaces, formed on said first insulation layer with a high etching selectivity with respect to said first insulation layer;

a first hole defined by the one of said side surfaces of said first insulation layer that reaches said surface of said conductive region;

a second hole defined by the side surfaces of said second insulation layer larger than said first hole and being in communication with said first hole; and a second conductive layer formed inside said first and second holes so as to be electrically connected to said conductive region and to be electrically insulated from said first conductive layer, wherein the one of said side surfaces of the first insulation layer defining the first hole is not aligned with the junction surface of the conductive region and the semiconductor substrate.

8. The semiconductor device having a conductive layer contact structure according to claim 7, wherein said first insulation layer includes upper and lower insulation layers, and said second insulation layer has a high etching selectivity with respect to the upper insulation layer of said first insulation layer.

9. The semiconductor device having a conductive layer contact structure according to claim 7, further including a sidewall insulation film formed at an inner sidewall of said second insulation layer defining said second hole.

10. The semiconductor device having a conductive layer contact structure according to claim 9, wherein said sidewall insulation film has a high etching selectivity with respect to said first insulation layer.

11. The semiconductor device having a conductive layer contact structure according to claim 8, further including a sidewall insulation film formed at an inner sidewall of said second insulation layer defining said second hole.

12. The semiconductor device having a conductive layer contact structure according to claim 11, wherein said sidewall insulation film has a high etching selectivity with respect to the upper insulation layer of said first insulation layer.

13. The semiconductor device having a conductive layer contact structure according to claim 7, wherein said second hole exists at a location overlapping a portion of said first conductive layer.

* * * * *

UNITED STATES PATENT AND TRADEMARK OFFICE
CERTIFICATE OF CORRECTION

PATENT NO. : 6,731,008 B1
DATED : May 4, 2004
INVENTOR(S) : Kazuo Tomita et al.

It is certified that error appears in the above-identified patent and that said Letters Patent is hereby corrected as shown below:

<u>Title page, Item [54] and Column 1, line 1,</u>
Change the title from "SEMICONDUCTOR DEVICE WITH CONDUCTIVE CONTACT LAYER STRUCTURE" to -- SEMICONDUCTOR DEVICE WITH CONDUCTIVE LAYER CONTACT STRUCTURE --.

Signed and Sealed this

Eighteenth Day of January, 2005

JON W. DUDAS
*Director of the United States Patent and Trademark Office*